(12) United States Patent
Feucht et al.

(10) Patent No.: US 11,959,947 B2
(45) Date of Patent: Apr. 16, 2024

(54) OVERVOLTAGE PROTECTION CIRCUIT FOR A CONTROL UNIT FOR A VEHICLE, CONTROL UNIT FOR A VEHICLE AND METHOD FOR TESTING AN OVERVOLTAGE PROTECTION CIRCUIT FOR A CONTROL UNIT FOR A VEHICLE

(71) Applicant: Knorr-Bremse Systeme Fuer Nutzfahrzeuge GmbH, Munich (DE)

(72) Inventors: Thomas Feucht, Wimsheim (DE); Guenter Herrmann, Stuttgart (DE); Frank Scholl, Ingersheim (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 367 days.

(21) Appl. No.: 17/288,868

(22) PCT Filed: Sep. 30, 2019

(86) PCT No.: PCT/EP2019/076436
§ 371 (c)(1),
(2) Date: Apr. 26, 2021

(87) PCT Pub. No.: WO2020/088864
PCT Pub. Date: May 7, 2020

(65) Prior Publication Data
US 2022/0003801 A1 Jan. 6, 2022

(30) Foreign Application Priority Data
Oct. 29, 2018 (DE) .................... 10 2018 126 913.7

(51) Int. Cl.
*G01R 19/165* (2006.01)
*G01R 31/00* (2006.01)
*B60L 3/00* (2019.01)

(52) U.S. Cl.
CPC ..... *G01R 19/16571* (2013.01); *G01R 31/006* (2013.01); *B60L 3/0046* (2013.01)

(58) Field of Classification Search
CPC .......... H02H 9/04; H02H 3/202; H02H 9/046; H02H 11/003; H02H 3/44; H02H 3/445; G01R 31/006
(Continued)

(56) References Cited

U.S. PATENT DOCUMENTS

| 6,218,819 | B1 | 4/2001 | Tiwari | |
| 2004/0052022 | A1* | 3/2004 | Laraia | H01L 27/0285 361/91.1 |
| 2008/0266739 | A1 | 10/2008 | Migliavacca | |
| 2010/0194352 | A1 | 8/2010 | Kitano et al. | |
| 2014/0043715 | A1 | 2/2014 | Cosgrave et al. | |
| 2017/0029241 | A1* | 2/2017 | Gewinner | B66B 5/0031 |

FOREIGN PATENT DOCUMENTS

| CN | 201829922 U | 5/2011 |
| CN | 105788556 A | 7/2016 |

(Continued)

OTHER PUBLICATIONS

International Search Report for PCT/EP2019/076436 dated Feb. 12, 2020.

*Primary Examiner* — Danny Nguyen
(74) *Attorney, Agent, or Firm* — NORTON ROSE FULBRIGHT US LLP; Gerard A. Messina

(57) ABSTRACT

An overvoltage protection circuit for a control unit for a vehicle includes an input terminal for applying an electrical input voltage, a test terminal for applying an electrical test voltage, and an output terminal for providing an electrical output voltage to supply the control unit. The overvoltage protection circuit also includes a reference device to provide a reference voltage using the input voltage. The overvoltage protection circuit includes a dividing device to provide a divided voltage using the output voltage. The overvoltage
(Continued)

protection circuit includes a control device to provide a regulation signal using the reference and divided voltages. The overvoltage protection circuit includes a regulation device connected between the input and output terminals. The regulation device provides the output voltage using the input voltage and the regulation signal. The overvoltage protection circuit includes a modification device to modify a value of the divided voltage using the test voltage.

13 Claims, 4 Drawing Sheets

(58) Field of Classification Search
USPC .......................................................... 361/91.1
See application file for complete search history.

(56) References Cited

FOREIGN PATENT DOCUMENTS

| | | | |
|---|---|---|---|
| CN | 108023332 | A | 5/2018 |
| DE | 102012204376 | A1 | 9/2012 |
| DE | 102011089556 | A1 | 6/2013 |
| DE | 102013108302 | A1 | 2/2014 |
| DE | 112015002196 | T5 | 2/2017 |
| EP | 2568558 | A2 | 3/2013 |
| JP | S61070225 | A | 4/1986 |
| JP | 3860089 | B2 | 12/2006 |
| JP | 2013012000 | A | 1/2013 |
| JP | 2016208581 | A | 12/2016 |
| KR | 101245291 | B1 | 3/2013 |

\* cited by examiner

OVERVOLTAGE PROTECTION CIRCUIT FOR A CONTROL UNIT FOR A VEHICLE, CONTROL UNIT FOR A VEHICLE AND METHOD FOR TESTING AN OVERVOLTAGE PROTECTION CIRCUIT FOR A CONTROL UNIT FOR A VEHICLE

FIELD OF THE INVENTION

The present invention relates to an overvoltage protection circuit for a control unit for a vehicle, to a control unit for a vehicle and to a method for testing an overvoltage protection circuit for a control unit for a vehicle.

BACKGROUND INFORMATION

Overvoltage protection circuits for example in the form of Zener diodes, which usually cannot be checked for correct function during a service life of the control units, can be used for control units and the like.

SUMMARY OF THE INVENTION

Against this background it is an object of the present invention to provide an improved overvoltage protection circuit for a control unit for a vehicle, an improved control unit for a vehicle and an improved method for testing an overvoltage protection circuit for a control unit for a vehicle.

This object may be achieved through an overvoltage protection circuit for a control unit for a vehicle, through a control unit for a vehicle and through a method for testing an overvoltage protection circuit for a control unit for a vehicle in accordance with the principal descriptions herein.

An ability in particular to monitor an overvoltage protection for a control unit, in particular for a safety-relevant voltage supply component, can be provided according to embodiments. An overvoltage protection circuit can thus, for example, also be employed to increase safety requirements. For the realization of such an overvoltage protection circuit, in particular discrete components can according to embodiments be used, so that the overvoltage protection circuit can be adapted to requirements placed over broad voltage ranges. It can be made possible in this way to check an overvoltage protection circuit in a control unit. To test the overvoltage protection circuit, in particular a cyclic drive of the overvoltage protection circuit with two input levels of different heights can take place here.

Advantageously, in particular an economical, testable overvoltage protection for a voltage supply internal to the control unit can be provided according to embodiments. Here it can also for example be made possible for a voltage supply only to be switched on above a predefined voltage. Expressed otherwise, in particular a test of an overvoltage protection circuit in a normal voltage range can thus be enabled during a full service life of the circuit. In addition, the overvoltage protection circuit can, for example, be constructed without special components, or only using standard components. Furthermore in particular an adjustment of an arbitrary clamping voltage can be enabled both in a normal operation and in a test operation of the overvoltage protection circuit. Such a test operation, or a performance of a test, can take place making use only of an additional terminal for test activation, so that resources, in particular in terms of hardware, can be saved.

An overvoltage protection circuit for a control unit for a vehicle has the following features:

an input terminal for the application of an electrical input voltage, a test terminal for the application of an electrical test voltage, and an output terminal for the provision of an electrical output voltage to supply the control unit;

a reference device that is configured to provide a reference voltage using the input voltage;

a dividing device that is configured to provide a divided voltage using the output voltage;

a control device that is configured to provide a regulation signal using the reference voltage and the divided voltage;

a regulation device that is connected between the input terminal and the output terminal, wherein the regulation device is configured to provide the output voltage using the input voltage and the regulation signal; and a modification device that is configured to modify a value of the divided voltage using the test voltage.

The overvoltage protection circuit can be implemented as a part of the control unit, or it can be integrable into the control unit. The control unit may have been or be arranged in the vehicle. The vehicle can be a motor vehicle, in particular a land vehicle, aircraft or watercraft, for example a passenger car, truck or another commercial vehicle. In connection with the overvoltage protection circuit, "connected" can mean that an electrical connection is established directly or via at least one component, for example an electrical resistor or the like. The regulation signal can represent an electrical voltage and, in addition or as an alternative, an electrical current. The individual devices can be realized using discrete components, for example using resistors and transistors.

According to one embodiment, the regulation device can comprise a transistor with a first terminal, a second terminal and a control terminal for receiving the regulation signal. The first terminal of the transistor can be connected here to the input terminal. The second terminal of the transistor can be connected to the output terminal. The control terminal of the transistor can be connected to the control device. The transistor can be a pnp transistor. Another suitable type of transistor can, however, also be used as the transistor. Such an embodiment offers the advantage that a secure output voltage, protected against overvoltage, can be provided in a simple manner.

The control device can further comprise an operational amplifier with an inverting input, a non-inverting input, and an output. The inverting input of the operational amplifier can here be connected to the reference device to receive the reference voltage. The non-inverting input of the operational amplifier can be connected to the dividing device for receiving the divided voltage and to the modification device for modifying the divided voltage. The output of the operational amplifier can be connected to the regulation device to provide the regulation signal. Put more precisely, the output of the operational amplifier can be connected to the control terminal of the transistor of the regulation device. Such an embodiment offers the advantage that a reliable protection against overvoltage can be provided. A regulation signal in particular can be provided here that is suitable for a secure regulation of the output voltage.

The modification device can also comprise a switch and an electrical modification resistor. The switch and the modification resistor can here be connected to one another in series between a reference potential and the control device. A control terminal of the switch can be connected here to the test terminal. Put more precisely, the switch and the modification resistor can be connected to one another in series between the reference potential and the non-inverting input of the operational amplifier of the control device. The switch can be implemented as an npn transistor or as another suitable type of transistor. Such an embodiment offers the advantage that the testability of the overvoltage protection circuit can be realized in a simple and secure manner.

In addition, the dividing device can comprise a first electrical dividing resistor and a second electrical dividing resistor. A first terminal of the first dividing resistor can here be connected to the output terminal. A second terminal of the first dividing resistor can be connected to a first terminal of the second dividing resistor. A second terminal of the second dividing resistor can be connected to the reference potential. The second terminal of the first dividing resistor can be connected to the control device for provision of the divided voltage. Resistance values of the dividing resistors can here be predefined in accordance with the application scenario. Such an embodiment offers the advantage that the divided voltage can be provided reliably and accurately.

The reference device can further comprise a reference terminal for the application of the reference voltage. The reference device can alternatively comprise a reference resistor, a first diode and a second diode. The reference resistor, the first diode and the second diode can here be connected to one another in series between a control terminal for the application of an electrical control voltage and the reference potential, or between the input terminal and the reference potential. A reference node between the first diode and the second diode can be connected to the control device. The first diode can be implemented as a Zener diode or another suitable type of diode. The second diode can be implemented as a Zener diode or another suitable type of diode. Such an embodiment offers the advantage that a reference voltage can be provided without great effort. A switch-on hysteresis of the overvoltage protection circuit can also be adjusted in particular by the first diode. If the reference resistor, the first diode and the second diode are connected to one another in series between the input terminal and the reference potential, a number of terminals related to the control unit can be reduced.

In terms of the control device in particular, the operational amplifier can comprise two npn amplifier transistors, one pnp amplifier transistor, two amplifier capacitors and three electrical amplifier resistors. The inverting input of the operational amplifier can here be implemented as a control terminal of a first of the npn amplifier transistors. The non-inverting input of the operational amplifier can be implemented as a control terminal of a second of the npn amplifier transistors. A first terminal of the first of the npn amplifier transistors and a first terminal of the second of the npn amplifier transistors can be connected to the reference potential via a first of the amplifier resistors. A second terminal of the first of the npn amplifier transistors can be connected to a second terminal of the pnp amplifier transistor and to the regulation device for the provision of the regulation signal. A second terminal of the second of the npn amplifier transistors can be connected to the output terminal. A first terminal of the pnp amplifier transistor can be connected to the input terminal. A control terminal of the pnp amplifier transistor can be connected to the regulation device via a second of the amplifier resistors. A first terminal of a first of the amplifier capacitors can be connected to the input terminal. A second terminal of the first of the amplifier capacitors can be connected between the control terminal of the pnp amplifier transistor and the second of the amplifier resistors. A first terminal of a third of the amplifier resistors can be connected to the control terminal of the first of the npn amplifier transistors. A second terminal of the third of the amplifier resistors can be connected to the output terminal. A first terminal of a second of the amplifier capacitors can be connected to the control terminal of the first of the npn amplifier transistors. A second terminal of the second of the amplifier capacitors can be connected to the reference potential. The amplifier transistors can also be other suitable types of transistor. Such an embodiment offers the advantage that a regulation signal that enables a secure protection against overvoltage can be provided in a reliable manner.

According to one embodiment, the overvoltage protection circuit can comprise an adjusting device for adjusting the regulation signal using the input voltage. The adjusting device here can comprise a series circuit of a switch and a first electrical adjusting resistor that can be connected between the control device and the reference potential. The switch can here be switchable depending on the input voltage. Put more precisely, the series circuit can be connected between the first terminal of the second of the npn amplifier transistors of the operational amplifier of the control device and the reference potential. Such an embodiment offers the advantage that a base current of the transistor of the regulation device can be controlled depending on the input voltage.

The switch of the adjusting device can also be implemented as a first npn adjusting transistor. The adjusting device can here further comprise a second npn adjusting transistor, a second adjusting resistor, a third adjusting resistor, a fourth adjusting resistor and a fifth adjusting resistor. A first terminal of the first npn adjusting transistor can be connected to a first terminal of the first adjusting resistor. A second terminal of the first adjusting resistor can be connected to the reference potential. A second terminal of the first npn adjusting transistor can be connected to the control device. A control terminal of the first npn adjusting transistor can be connected to a second terminal of the second npn adjusting transistor. The first terminal of the second npn adjusting transistor can be connected to the reference potential. The second adjusting resistor and the third adjusting resistor can be connected to one another in series between the input terminal and the reference potential. A control terminal of the second npn adjusting transistor can be connected to an adjusting node between the second adjusting resistor and the third adjusting resistor. A first terminal of the fourth adjusting resistor can be connected to the adjusting node. A second terminal of the fourth adjusting resistor can be connected to the second terminal of the second npn adjusting transistor. A first terminal of the fifth adjusting resistor can be connected to the second terminal of the second npn adjusting transistor. A second terminal of the fifth adjusting resistor can be connected to the input terminal. Put more precisely, the second terminal of the first npn adjusting transistor can be connected to the first terminal of the second of the npn amplifier transistors of the operational amplifier of the control device. The adjusting transistors can alternatively also be other suitable types of transistor. Such an embodiment offers the advantage that a switching regulator of the control unit can also be supplied in an appropriate manner by the output voltage.

The overvoltage protection circuit can further comprise an electrical limiting resistor. A first terminal of the limiting resistor can be connected here to the input terminal. A second terminal of the limiting resistor can be connected to the regulation device. The second terminal of the limiting resistor can be connected to the first terminal of the transistor of the regulation device. A resistance value of the limiting resistor can be predefinable depending on an intended current limitation of an output current. A predefinable current limitation can thus be realized in a simple manner.

A control unit for a vehicle comprises an embodiment of the above-described overvoltage protection circuit and a voltage supply terminal, wherein the output terminal of the overvoltage protection circuit is connected to the voltage supply terminal of the control unit.

The overvoltage protection circuit can be employed advantageously in connection with the control unit, or used to provide an overvoltage protection with regard to a voltage supply of the control unit.

According to one embodiment, the control unit can include a test device for testing a functionality of the overvoltage protection circuit. The test device can be configured here to capture a first value or first value profile of the electrical output voltage while the electrical test voltage having a first voltage level is present at the test terminal, and to capture a second value or second value profile of the electrical output voltage while the electrical test voltage having a second voltage level is present at the test terminal. The test device can provide a test signal using the first value or first value profile and the second value or second value profile. The test device can, for example, be used to check the functionality of the overvoltage protection circuit during commissioning of the control unit or during a functional test of the control unit.

A method for testing an overvoltage protection circuit for a control unit for a vehicle, wherein the overvoltage protection circuit is an embodiment of the above-described overvoltage protection circuit, has the following steps:

application of an electrical test voltage with a first voltage level to the test terminal of the overvoltage protection circuit;

capture of a first electrical output voltage in response to the electrical test voltage with the first voltage level;

application of an electrical test voltage with a second voltage level to the test terminal of the overvoltage protection circuit, wherein the second voltage level is lower than the first voltage level;

capture of a second electrical output voltage in response to the electrical test voltage with the second voltage level;

checking whether the captured first output voltage and the captured second output voltage satisfy at least one test criterion in order to generate a test result.

The method for testing can be carried out in order to check an embodiment of the above-described overvoltage protection circuit in an advantageous manner for its functional capability.

Exemplary embodiments of the approach presented here are explained in more detail in the following description with reference to the figures.

DETAILED DESCRIPTION

Figure 1:
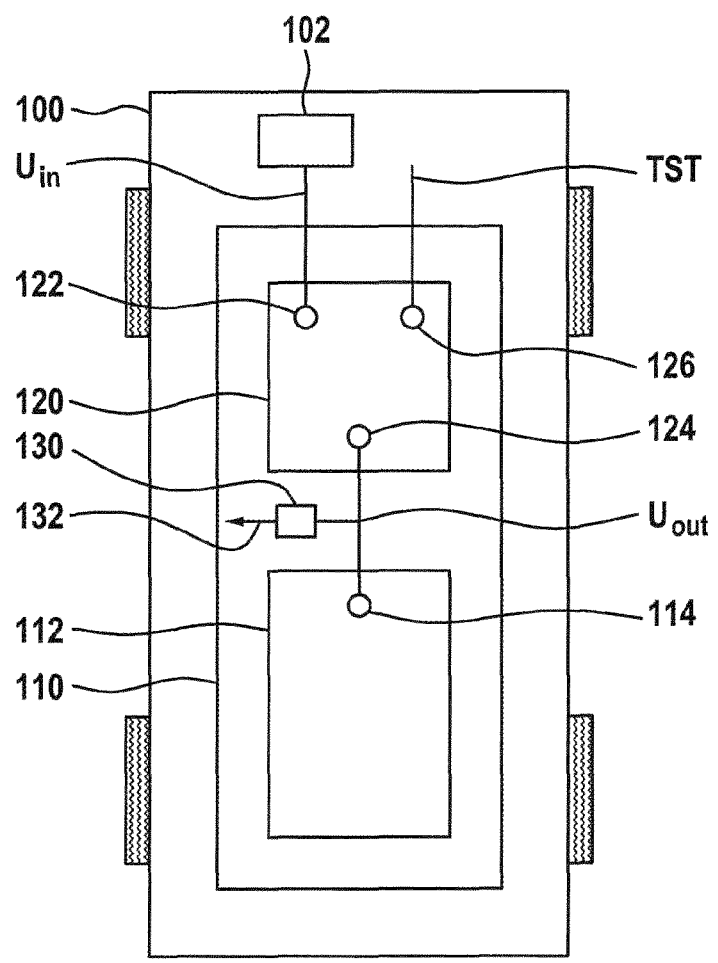
FIG. 1 shows a schematic illustration of a vehicle with a control unit according to one exemplary embodiment.

FIG. 1 shows a schematic illustration of a vehicle 100 with a control unit 110 according to one exemplary embodiment. The vehicle 100 is a motor vehicle, for example a passenger car, a truck or another commercial vehicle. The control unit 110 is arranged in the vehicle 100. The vehicle 100 thus comprises the control unit 110. The control unit 110 comprises an input for the application of an electrical input voltage $U_{in}$. The input voltage $U_{in}$ is, for example, provided by a battery 102 of the vehicle 100.

The control unit 110 comprises a control unit device 112 that is configured to carry out a control function of the control unit 110. The control function relates, for example, to the activation of at least one actuator of a vehicle system of the vehicle, for example a braking system.

To supply the control unit device 112 with electrical energy, the control unit device 112 comprises a voltage supply terminal 114. The control unit device 112 can be supplied with electrical voltage via the voltage supply terminal 114.

The control unit 110 comprises an overvoltage protection circuit 120 that is connected between the voltage supply terminal 114 of the control unit device 112 and the input of the control unit 110 for the application of the electrical input voltage $U_{in}$. The overvoltage protection circuit 120 is configured to bring about a protection against electrical overvoltage for the control unit 110 or, in particular, for the control unit device 112 of the control unit 110.

As regards the overvoltage protection circuit 120, an input terminal 122 for the application of the electrical input voltage $U_{in}$ to the overvoltage protection circuit 120, an output terminal 124 for the provision of an electrical output voltage $U_{out}$ for the supply of the control unit 110 or of the control unit device 112, and a test terminal 126 for the application of an electrical test voltage TST to the overvoltage protection circuit 120 are shown in the illustration of FIG. 1. The overvoltage protection circuit 120 and the control unit device 112 are connected to one another. The output terminal 124 of the overvoltage protection circuit 120 is connected here to the voltage supply terminal 114. The structure and the function of the overvoltage protection circuit 120 in accordance with various exemplary embodiments is described with reference to the following figures.

According to one exemplary embodiment, a test device 130 that is configured to test a functionality of the overvoltage protection circuit 120 is provided. The test device 130 is, according to one exemplary embodiment, integrated into the control unit 110, but can also be part of the overvoltage protection circuit 120, or be in the form of a circuit arranged externally to the control unit 110. The test device 130 is configured to capture a first value or first value profile of the electrical output voltage $U_{out}$ while the electrical test voltage TST having a first voltage level is present at the test terminal 126. The test device 130 is further configured to capture a second value or second value profile of the electrical output voltage $U_{out}$ while the electrical test voltage TST having a second voltage level is present at the test terminal 126. The test device 130 is configured, using the first value or first value profile and the second value or second value profile, to determine a test result and to provide a test signal 132 indicating the test result. The test signal 132 indicates, for example, a correct functionality of the overvoltage protection circuit 120, and, additionally or alternatively, a faulty functionality of the overvoltage protection circuit 120. According to one exemplary embodiment, the test device 130 is configured to receive the test voltage TST. Alternatively, the test device 130 is configured to provide the test voltage TST.

Figure 2:
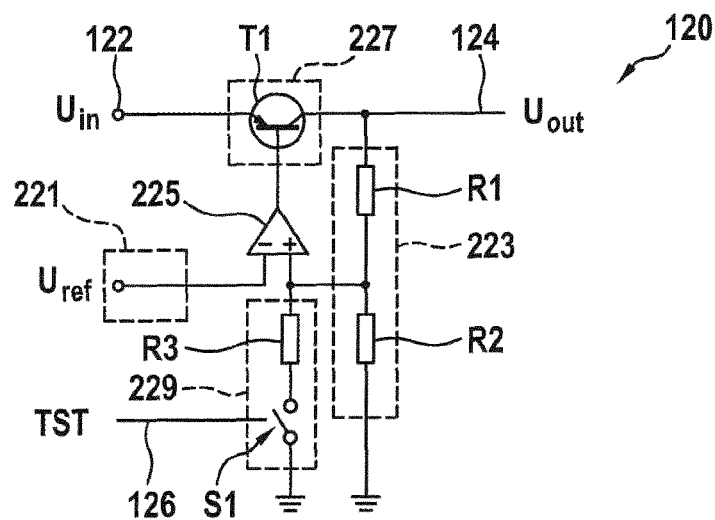
FIG. 2 shows a schematic circuit diagram of the overvoltage protection circuit of FIG. 1.

FIG. 2 shows a schematic circuit diagram of the overvoltage protection circuit 120 of FIG. 1 according to one exemplary embodiment. In the schematic circuit diagram of FIG. 2, the input terminal 122 for the application of the input voltage $U_{in}$, the output terminal 124 for provision of the output voltage $U_{out}$, the test terminal 126 for the application of the test voltage TST, as well as, furthermore, a reference device 221, a reference voltage $U_{ref}$, a dividing device 223 with a first electrical dividing resistor R1 and a second electrical dividing resistor R2, a control device 225, a regulation device 227 with a transistor T1, and a modification device 229 with an electrical modification resistor R3 and a switch S1 are shown from the overvoltage protection circuit 120.

The reference device 221 is configured to provide the reference voltage $U_{ref}$. According to the exemplary embodiment illustrated here, the reference device 221 comprises a reference terminal for the application of the reference voltage $U_{ref}$. According to one exemplary embodiment, the reference device 221 is configured to provide the reference voltage $U_{ref}$ using the input voltage $U_{in}$.

The dividing device 223 is configured to provide a divided voltage using the output voltage $U_{out}$. According to the exemplary embodiment illustrated here, the dividing device 223 comprises a series circuit of the first electrical dividing resistor R1 and the second electrical dividing resistor R2. A first terminal of the first dividing resistor R1 is connected to the output terminal 124. A second terminal of the first dividing resistor R1 is connected to a first terminal of the second dividing resistor R2. A second terminal of the second dividing resistor R2 is connected to the reference potential. The second terminal of the first dividing resistor R1 is connected to the control device 225 for provision of the divided voltage.

The control device 225 is configured to provide a regulation signal using the reference voltage $U_{ref}$ and the divided voltage. According to the exemplary embodiment illustrated here, the control device 225 comprises an operational amplifier. The operational amplifier comprises an inverting input (−), a non-inverting input (+) and an output. The inverting input of the operational amplifier is connected to the reference device 221 to receive the reference voltage $U_{ref}$. The non-inverting input of the operational amplifier is connected to the dividing device 223 for receiving the divided voltage and to the modification device 229 for modifying the divided voltage. The output of the operational amplifier is connected to the regulation device 227 to provide the regulation signal.

The regulation device 227 is connected between the input terminal 122 and the output terminal 124. The regulation device 227 is configured to provide or to regulate the output voltage $U_{out}$ using the input voltage $U_{in}$ and the regulation signal. According to the exemplary embodiment illustrated here, the regulation device 227 comprises the transistor T1. The transistor T1 comprises a first terminal, a second terminal and a control terminal for receiving the regulation signal. The first terminal of the first transistor T1 is connected to the input terminal 122. The second terminal of the transistor T1 is connected to the output terminal 124. The control terminal of the transistor T1 is connected to the control device 225. According to the exemplary embodiment illustrated here, the transistor T1 is a pnp transistor.

The modification device 229 is configured to modify a value of the divided voltage provided by the dividing device 223 using the test voltage TST. The modification device 229 is connected for this purpose to the test input 126, or the modification device 229 comprises the test input 146. According to the exemplary embodiment illustrated here, the modification device 229 comprises the switch S1 and the electrical modification resistor R3. The switch S1 and the modification resistor R3 are connected to one another in series between the reference potential and the control device 225, put more precisely the non-inverting input of the operational amplifier of the control device 225. A control terminal of the switch S1 is connected to the test terminal 126. According to the exemplary embodiment illustrated here, the switch S1 is connected between the modification resistor R3 and the reference potential. Alternatively, the positions of the switch S1 and the modification resistor R3 can be exchanged.

The test voltage TST present at the test input 126 is used to modify a resistance value of a total resistance that is found between the non-inverting input (+) of the operational amplifier 225 and the reference potential. The switch S1 is opened and closed for this purpose depending on a voltage level of the test voltage TST.

The overvoltage protection circuit 120 can be employed as what is known as a testable PRESTAB in safety-critical systems.

Figure 3:
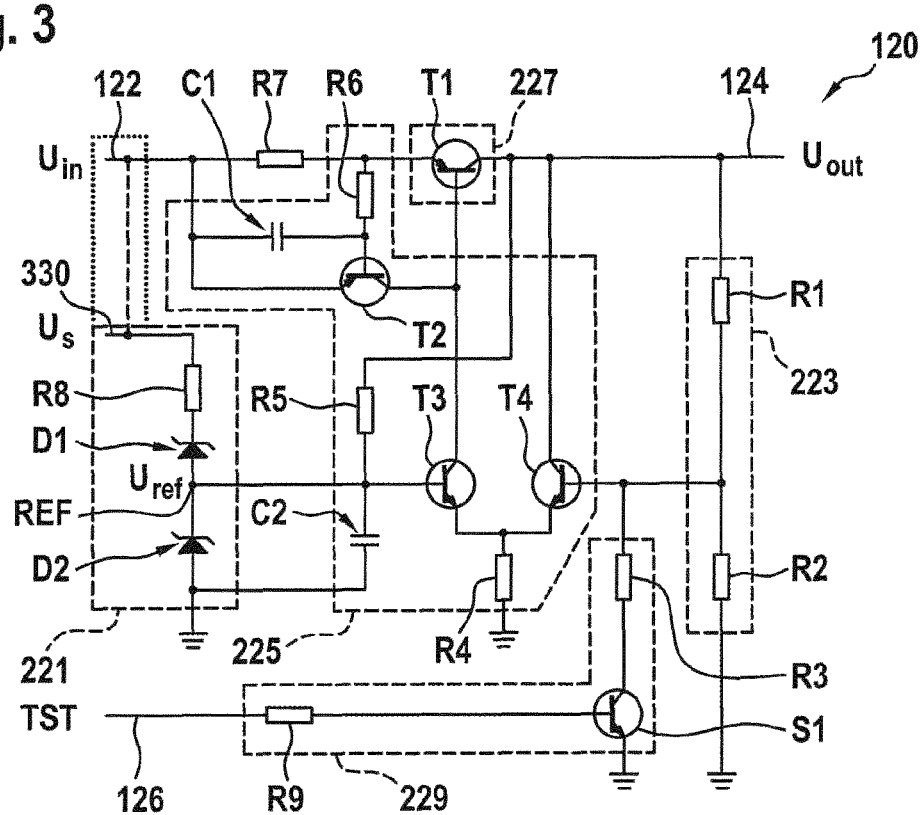
FIG. 3 shows a circuit diagram of the overvoltage protection circuit of FIG. 1 or FIG. 2.

FIG. 3 shows a circuit diagram of the overvoltage protection circuit 120 of FIG. 1 or FIG. 2 according to one exemplary embodiment. The overvoltage protection circuit 120 here corresponds to the overvoltage protection circuit of FIG. 2 apart from the fact that the reference device 221 has a different implementation and/or is illustrated in more detail, that in addition an electrical limiting resistor R7 is provided, that the modification device 229 comprises a switch S1 in the form of a transistor and in addition an electrical series resistor R9, and that the operational amplifier of the control device 225 is illustrated in more detail.

The limiting resistor R7 is predefinable in terms of a resistance value in order to adjust a current limitation of an electrical output current of the overvoltage protection circuit 120. A first terminal of the limiting resistor R7 is connected to the input terminal 122. A second terminal of the limiting resistor R7 is connected to the regulation device 227, put more precisely to the first terminal of the transistor T1 of the regulation device 227.

The switch S1, implemented as a transistor, put more precisely as an npn transistor, of the modification device 229 comprises a first terminal, a second terminal and a control terminal. The first terminal of the switch S1 is connected to the reference potential. The second terminal of the switch S1 is connected to the modification resistor R3. The control terminal of the switch S1 is connected to the test terminal TST via the series resistor R9. The series resistor R9 is thus connected between the test terminal TST and the control terminal of the switch S1.

According to the exemplary embodiment illustrated here, the reference device 221 comprises a reference resistor R8, a first diode D1 and a second diode D2. A reference node REF between the first diode D1 and the second diode D2 is connected to the control device 225. The reference voltage U ref is present at the reference node REF. According to the exemplary embodiment illustrated here, the reference resistor R8, the first diode D1 and the second diode D2 are connected to one another in series between a control terminal 330 for the application of an electrical control voltage $U_s$ and the reference potential. In particular, according to the exemplary embodiment illustrated here, the first diode D1 is connected between the reference resistor R8 and the second diode D2 or the reference node REF. According to an alternative exemplary embodiment, the control terminal 330 can be omitted, in which case the reference resistor R8, the first diode D1 and the second diode D2 are connected to one another in series between the input terminal 122 and the reference potential.

According to the exemplary embodiment illustrated here, the operational amplifier of the control device 225 comprises a first amplifier capacitor C1, a second amplifier capacitor C2, a first electrical amplifier resistor R4, a second electrical amplifier resistor R6, a third electrical amplifier resistor R5, a pnp amplifier transistor T2, a first npn amplifier transistor T3 and a second npn amplifier transistor T4.

The inverting input of the operational amplifier is implemented as a control terminal of the first npn amplifier transistor T3. The non-inverting input of the operational amplifier is implemented as a control terminal of the second npn amplifier transistor T4. A first terminal of the first npn amplifier transistor T3 and a first terminal of the second npn amplifier transistor T4 are connected to the reference potential via the first amplifier resistor R4. A second terminal of the first npn amplifier transistor T3 is connected to a second terminal of the pnp amplifier transistor T2. The second terminal of the first npn amplifier transistor T3 is further connected to the regulation device 227, put more precisely to the control input of the transistor T1 of the regulation device 227, for the provision of the regulation signal. A second terminal of the second npn amplifier transistor T4 is connected to the output terminal 124. A first terminal of the pnp amplifier transistor T2 is connected to the input terminal 122. A control terminal of the pnp amplifier transistor T2 is connected via the second amplifier resistor R6 to the regulation device 227, put more precisely to the first input of the transistor T1 of the regulation device 227.

A first terminal of the first amplifier capacitor C1 of the operational amplifier is connected to the input terminal 122. A second terminal of the first amplifier capacitor C1 is connected between the control terminal of the pnp amplifier transistor T2 and the second amplifier resistor R6. A first terminal of the third amplifier resistor R5 is connected to the control terminal of the first npn amplifier transistor T3. A second terminal of the third amplifier resistor R5 is connected to the output terminal 124. A first terminal of the second amplifier capacitor C2 is connected to the control terminal of the first npn amplifier transistor T3. A second terminal of the second amplifier capacitor C2 is connected to the reference potential.

Parameters that are merely exemplary are illustrated below for some components of the overvoltage protection circuit 120. The first amplifier capacitor C1 can have a capacitance value of 1 nanofarad. The second amplifier capacitor C2 can have a capacitance value of 100 nanofarads. The first dividing resistor R1 can have a resistance value of 23.7 kiloohms. The second dividing resistor R2 can have a resistance value of 10 kiloohms. The modification resistor R3 can have a resistance value of 6.81 kiloohms. The first amplifier resistor R4 can have a resistance value of 750 ohms. The second amplifier resistor R6 can have a resistance value of 100 ohms.

The third amplifier resistor R5 can have a resistance value of 26.1 kiloohms. The reference resistor R8 can have a resistance value of 26.1 kiloohms. The series resistor R9 can have a resistance value of 10 kiloohms.

Figure 4:
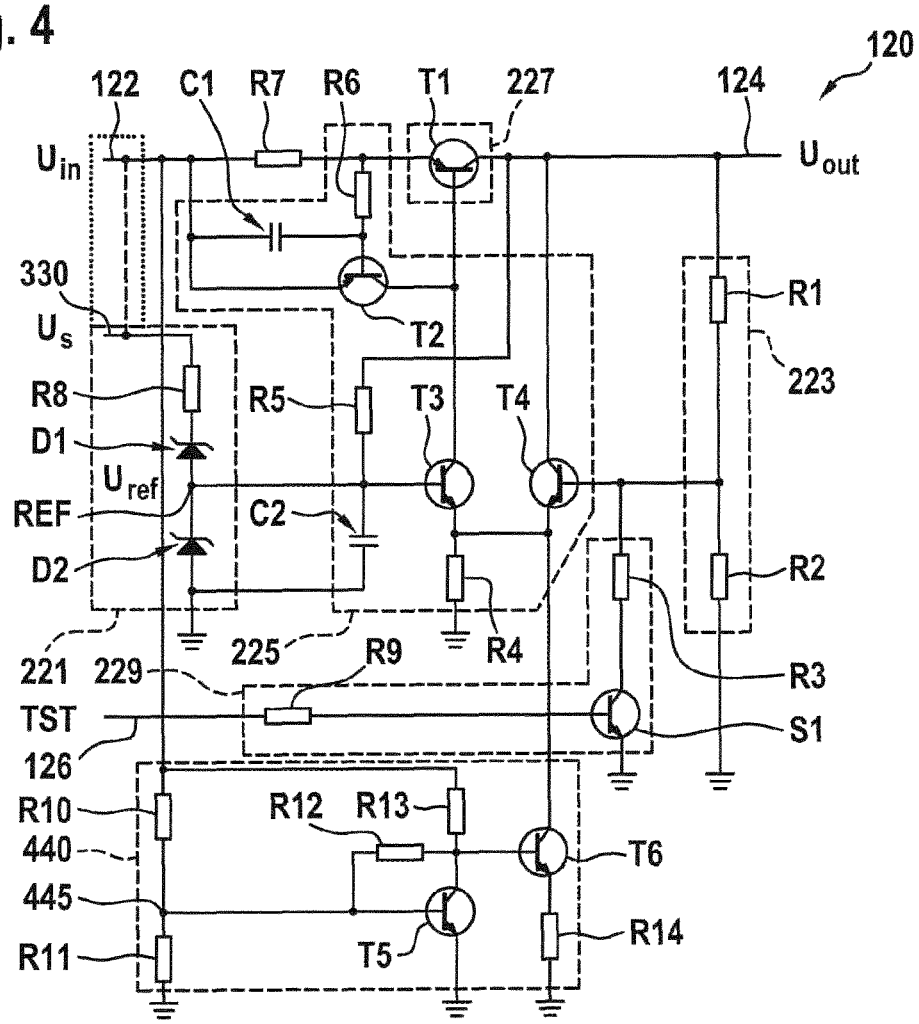
FIG. 4 shows a circuit diagram of the overvoltage protection circuit of FIG. 3 with an adjusting device.

FIG. 4 shows a schematic circuit diagram of the overvoltage protection circuit 120 of FIG. 3 with an adjusting device 440 according to one exemplary embodiment. With the exception of the adjusting device 440 additionally provided according to the exemplary embodiment illustrated in FIG. 4, the overvoltage protection circuit 120 corresponds to the overvoltage protection circuit of FIG. 3. The adjusting device 440 comprises an adjusting node 445, a first electrical adjusting resistor R14, a second electrical adjusting resistor R10, a third electrical adjusting resistor R11, a fourth electrical adjusting resistor R12, a fifth electrical adjusting resistor R13, a first npn adjusting transistor T6 and a second npn adjusting transistor T5.

The adjusting device 440 is configured to adjust the regulation signal using the input voltage $U_{in}$. The adjusting device 440 comprises a series circuit of a switch in the form of the first npn adjusting transistor T6 and the first electrical adjusting resistor R14. This series circuit is connected between the control device 225 and the reference potential. The first npn adjusting transistor T6 or switch is switchable depending on the input voltage $U_{in}$.

A first terminal of the first npn adjusting transistor T6 is connected to a first terminal of the first adjusting resistor R14. A second terminal of the first adjusting resistor R14 is connected to the reference potential. A second terminal of the first npn adjusting transistor T6 is connected to the control device 225, put more precisely to the first terminal of the second npn amplifier transistor T4 of the operational amplifier of the control device 225. A control terminal of the first npn adjusting transistor T6 is connected to a second terminal of the second npn adjusting transistor T5. The first terminal of the second npn adjusting transistor T5 is connected to the reference potential. The second adjusting resistor R10 and the third adjusting resistor R11 are connected to one another in series between the input terminal 122 and the reference potential. The adjusting node 445 is arranged between the second adjusting resistor R10 and the third adjusting resistor R11. A control terminal of the second npn adjusting transistor T5 is connected to the adjusting node 445. A first terminal of the fourth adjusting resistor R12 is connected to the adjusting node 445. A second terminal of the fourth adjusting resistor R12 is connected to the second terminal of the second npn adjusting transistor T5. A first terminal of the fifth adjusting resistor R13 is connected to the second terminal of the second npn adjusting transistor T5. A second terminal of the fifth adjusting resistor R13 is connected to the input terminal 122.

Parameters that are merely exemplary are illustrated below for some components of the adjusting device 440 of the overvoltage protection circuit 120. The first adjusting resistor R14 can have a resistance value of 60 ohms. The second adjusting resistor R10 can have a resistance value of 100 kiloohms. The third adjusting resistor R11 can have a resistance value of 3.83 kiloohms. The fourth adjusting resistor R12 can have a resistance value of 21.5 kiloohms. The fifth adjusting resistor R13 can have a resistance value of 51.1 kiloohms.

Figure 5:
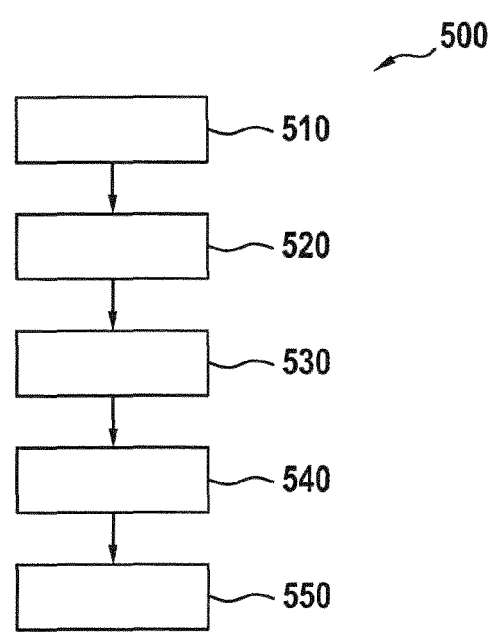
FIG. 5 shows a flow diagram of a method for testing according to one exemplary embodiment.

FIG. 5 shows a flow diagram of a method 500 for testing according to one exemplary embodiment. The method 500 for testing can be carried out in order to test an overvoltage protection circuit for a control unit for a vehicle. Put more precisely, the method 500 for testing can be carried out in order to test the overvoltage protection circuit from one of the previously described figures or a similar overvoltage protection circuit.

The method 500 can, for example, be carried out using a test device as is described with reference to FIG. 1.

Here, in a first step 510 of application, an electrical test voltage with a first voltage level is applied to the test terminal of the overvoltage protection circuit. Subsequently, in a first step 520 of capture, a first electrical output voltage in response to the electrical test voltage with the first voltage level is captured. Subsequently again, in a second step 530 of application, an electrical test voltage with a second voltage level is applied to the test terminal of the overvoltage protection circuit. The second voltage level is lower than the first voltage level. Subsequently, in a second step 540 of capture, a second electrical output voltage in response to the electrical test voltage with the second voltage level is captured. In a step 550 of checking, a check is finally made as to whether the captured first output voltage and the captured second output voltage satisfy at least one test criterion in order to generate a test result.

A short functional description of exemplary embodiments of the present invention is provided below with reference to the above-described figures.

If a test voltage TST with the first voltage level of, for example, more than 1.5 volts is connected to the test input 126, the switch S1 of the modification device 229 is closed, and the output voltage $U_{out}$ is limited to, for example, $(U_{ref}-0.65V) \times (R1+R2\|R3)/R1$. The voltage value of 0.65 V here, although exemplary, is a typical value that emerges from the characteristic of the switching elements used. Below this voltage value or this clamping voltage, the output voltage $U_{out}$ follows the input voltage $U_{in}$, so that $U_{out}=U_{in}$ minus the voltage drop over the limiting resistor R7 and the transistor T1 of the regulation device 227.

If a test voltage TST with the second voltage level of, for example, less than 0.4 volts is connected to the test input 126, the switch S1 of the modification device 229 is opened, and the output voltage $U_{out}$ is limited to, for example, $(U_{ref}-0.65V) \times (R1+R2)/R1$. Below this voltage value or this clamping voltage, the output voltage $U_{out}$ follows the input voltage $U_{in}$, so that $U_{out}=U_{in}$ minus the voltage drop over the limiting resistor R7 and the transistor T1 of the regulation device 227.

The output voltage $U_{out}$ for the case of a closed switch S1 is thus limited to a first voltage value that depends on the reference voltage $U_{ref}$, the values of the resistors R1, R2, R3, and on a specific voltage value of the switching elements used.

The output voltage $U_{out}$ for the case of an opened switch S1 is accordingly limited to a second voltage value, different from the first voltage value, that depends on the reference voltage $U_{ref}$, the values of the resistors R1, R2, and on the specific voltage value of the switching elements used.

If the output voltage $U_{out}$ is measured, then the function of the overvoltage protection circuit 120 can be tested from an input voltage $U_{in}$ greater than the lower clamping voltage of the above-described clamping voltages plus the voltage drop across the limiting resistor R7 and the transistor T1 of the regulation device 227.

A switch-on hysteresis is present at the overvoltage protection circuit 120 which can be adjusted by way of the first diode D1, as well as a current limitation of an output current that can be adjusted by way of the limiting resistor R7.

The control voltage $U_s$ can be connected to the input voltage $U_{in}$, or can be used as a separate switching input or control terminal 330. This control terminal 330 may, for example, have been or be connected to a terminal of the vehicle 100.

The adjusting device 440 represents a circuit section that comprises the adjusting resistors R10 to R14 and the transistors T5 and T6 and is configured to control the regulation signal or a base current of the transistor T1 of the regulation device 227 depending on the input voltage $U_{in}$. It is thus possible with a low input voltage $U_{in}$ to generate a high or higher base current of the transistor T1 as the regulation signal, and at a high input voltage $U_{in}$ to generate a low or lower base current of the transistor T1 as the regulation signal without overloading the first npn amplifier transistor T3. This is particularly advantageous if the output voltage $U_{out}$ supplies a switching regulator of the control unit 110 that has a high input current requirement at low supply voltages and a lower input current requirement at high supply voltages.

LIST OF REFERENCE SIGNS

100 Vehicle
102 Battery
110 Control unit
112 Control unit device
114 Voltage supply terminal
120 Overvoltage protection circuit
122 Input terminal
124 Output terminal
126 Test terminal
130 Test device
132 Test signal
$U_{in}$ Input voltage
$U_{out}$ Output voltage
TST Test voltage
221 Reference device
223 Dividing device
225 Control device
227 Regulation device
229 Modification device
R1 First electrical dividing resistor
R2 Second electrical dividing resistor
R3 Electrical modification resistor
S1 Switch
T1 Transistor
$U_{ref}$ Reference voltage
330 Control terminal
C1 First amplifier capacitor
C2 Second amplifier capacitor
D1 First diode
D2 Second diode
REF Reference node
R4 First electrical amplifier resistor
R5 Third electrical amplifier resistor
R6 Second electrical amplifier resistor
R7 Electrical limiting resistor
R8 Electrical reference resistor
R9 Electrical series resistor
T2 pnp amplifier transistor
T3 First npn amplifier transistor
T4 Second npn amplifier transistor
$U_s$ Control voltage
440 Adjusting device
445 Adjusting node
R10 Second electrical adjusting resistor
R11 Third electrical adjusting resistor
R12 Fourth electrical adjusting resistor
R13 Fifth electrical adjusting resistor
R14 First electrical adjusting resistor
T5 Second npn adjusting transistor
T6 First npn adjusting transistor
500 Method for testing
510 First step of application
520 First step of capture
530 Second step of application
540 Second step of capture
550 Step of checking

The invention claimed is:

1. An overvoltage protection circuit for a control unit for a vehicle, comprising:

an input terminal for applying an electrical input voltage,
a test terminal for the application of an electrical test voltage, and an output terminal for providing an electrical output voltage to supply the control unit;
a reference device to provide a reference voltage using the input voltage;
a dividing device to provide a divided voltage using the output voltage;
a control device to provide a regulation signal using the reference voltage and the divided voltage;
a regulation device connected between the input terminal and the output terminal, wherein the regulation device is configured to provide the output voltage using the input voltage and the regulation signal;
a modification device to modify a value of the divided voltage using the test voltage; and
an adjusting device for adjusting the regulation signal using the input voltage, wherein the adjusting device includes a series circuit having a switch and a first electrical adjusting element, and wherein the switch is switchable depending on the input voltage.

2. The overvoltage protection circuit of claim 1, wherein the regulation device includes a transistor with a first terminal, a second terminal and a control terminal for reception of the regulation signal, wherein the first terminal of the transistor is connected to the input terminal, wherein the second terminal of the transistor is connected to the output terminal, and wherein the control terminal of the transistor is connected to the control device.

3. The overvoltage protection circuit of claim 1, wherein the control device includes an operational amplifier with an inverting input, a non-inverting input and an output, wherein the inverting input of the operational amplifier is connected to the reference device for receiving the reference voltage, wherein the non-inverting input of the operational amplifier is connected to the dividing device for receiving the divided voltage and to the modification device for modifying the divided voltage, and wherein the output of the operational amplifier is connected to the regulation device for providing the regulation signal.

4. The overvoltage protection circuit of claim 1, wherein the modification device includes a switch and an electrical modification resistor, wherein the switch and the modification resistor are connected to one another in series between a reference potential and the control device, and wherein a control terminal of the switch is connected to the test terminal.

5. The overvoltage protection circuit of claim 1, wherein the dividing device includes a first electrical dividing resistor and a second electrical dividing resistor, wherein a first terminal of the first dividing resistor is connected to the output terminal, wherein a second terminal of the first dividing resistor is connected to a first terminal of the second dividing resistor, wherein a second terminal of the second dividing resistor is connected to the reference potential, and wherein the second terminal of the first dividing resistor is connected to the control device for providing the divided voltage.

6. The overvoltage protection circuit of claim 1, wherein the reference device includes a reference terminal for the application of the reference voltage or a reference resistor, a first diode and a second diode, wherein the reference resistor, the first diode and the second diode are connected to one another in series between a control terminal for the application of an electrical control voltage and the reference potential, or between the input terminal and the reference potential, and wherein a reference node between the first diode and the second diode is connected to the control device.

7. The overvoltage protection circuit of claim 3, wherein the operational amplifier includes two npn amplifier transistors, a pnp amplifier transistor, two amplifier capacitors and three electrical amplifier resistors, wherein the inverting input of the operational amplifier is implemented as a control terminal of a first of the npn amplifier transistors, wherein the non-inverting input of the operational amplifier is implemented as a control terminal of a second of the npn amplifier transistors, wherein a first terminal of the first of the npn amplifier transistors and a first terminal of the second of the npn amplifier transistors are connected via a first of the amplifier resistors to the reference potential, wherein a second terminal of the first of the npn amplifier transistors is connected to a second terminal of the pnp amplifier transistor and to the regulation device for provision of the regulation signal, wherein a second terminal of the second of the npn amplifier transistors is connected to the output terminal, wherein a first terminal of the pnp amplifier transistor is connected to the input terminal, wherein a control terminal of the pnp amplifier transistor is connected via a second of the amplifier resistors to the regulation device, wherein a first terminal of a first of the amplifier capacitors is connected to the input terminal, wherein a second terminal of the first of the amplifier capacitors is connected between the control terminal of the pnp amplifier transistor and the second of the amplifier resistors, wherein a first terminal of a third of the amplifier resistors is connected to the control terminal of the first of the npn amplifier transistors, wherein a second terminal of the third of the amplifier resistors is connected to the output terminal, wherein a first terminal of a second of the amplifier capacitors is connected to the control terminal of the first of the npn amplifier transistors, and wherein a second terminal of the second of the amplifier capacitors is connected to the reference potential.

8. The overvoltage protection circuit of claim 1,
wherein the first electrical adjusting element includes a first electrical adjusting resistor that is connected between the control device and the reference potential.

9. The overvoltage protection circuit of claim 8, wherein the switch is implemented as a first npn adjusting transistor, wherein the adjusting device further includes a second npn adjusting transistor, a second adjusting resistor, a third adjusting resistor, a fourth adjusting resistor and a fifth adjusting resistor, wherein a first terminal of the first npn adjusting transistor is connected to a first terminal of the first adjusting resistor, wherein a second terminal of the first adjusting resistor is connected to the reference potential, wherein a second terminal of the first npn adjusting transistor is connected to the control device, wherein a control terminal of the first npn adjusting transistor is connected to a second terminal of the second npn adjusting transistor, wherein the first terminal of the second npn adjusting transistor is connected to the reference potential, wherein the second adjusting resistor and the third adjusting resistor are connected to one another in series between the input terminal and the reference potential, wherein a control terminal of the second npn adjusting transistor is connected to an adjusting node between the second adjusting resistor and the third adjusting resistor, wherein a first terminal of the fourth adjusting resistor is connected to the adjusting node, wherein a second terminal of the fourth adjusting resistor is connected to the second terminal of the second npn adjusting transistor, wherein a first terminal of the fifth adjusting resistor is connected to the second terminal of the second npn adjusting transistor, and wherein a second terminal of the fifth adjusting resistor is connected to the input terminal.

10. The overvoltage protection circuit of claim 1, further comprising:
an electrical limiting resistor, wherein a first terminal of the limiting resistor is connected to the input terminal, and wherein a second terminal of the limiting resistor is connected to the regulation device.

11. A control unit for a vehicle, comprising:
an overvoltage protection circuit, including:
an input terminal for applying an electrical input voltage, a test terminal for the application of an electrical test voltage, and an output terminal for providing an electrical output voltage to supply the control unit;
a reference device to provide a reference voltage using the input voltage;
a dividing device to provide a divided voltage using the output voltage;
a control device to provide a regulation signal using the reference voltage and the divided voltage;
a regulation device connected between the input terminal and the output terminal, wherein the regulation device is configured to provide the output voltage using the input voltage and the regulation signal; and
a modification device to modify a value of the divided voltage using the test voltage;
a voltage supply terminal, wherein the output terminal of the overvoltage protection circuit is connected to the voltage supply terminal of the control unit; and
a test device for testing a functionality of the overvoltage protection circuit, wherein the test device is configured to capture a first value or first value profile of the electrical output voltage, to capture a second value or second value profile of the electrical output voltage, and to provide a test signal using the first value or first value profile and the second value or second value profile.

12. The control unit of claim 11, further comprising:
wherein the test device is configured to capture the first value or the first value profile of the electrical output voltage while the electrical test voltage having a first voltage level is present at the test terminal, to capture the second value or the second value profile of the electrical output voltage while the electrical test voltage having a second voltage level at the test terminal.

13. A method for testing an overvoltage protection circuit for a control unit for a vehicle, the method comprising:
applying an electrical test voltage with a first voltage level to a test terminal of the overvoltage protection circuit, wherein the overvoltage protection circuit includes:
an input terminal for applying an electrical input voltage, a test terminal for the application of an electrical test voltage, and an output terminal for providing an electrical output voltage to supply the control unit;
a reference device to provide a reference voltage using the input voltage;
a dividing device to provide a divided voltage using the output voltage;
a control device to provide a regulation signal using the reference voltage and the divided voltage;
a regulation device connected between the input terminal and the output terminal, wherein the regulation device is configured to provide the output voltage using the input voltage and the regulation signal; and
a modification device to modify a value of the divided voltage using the test voltage;
capturing a first electrical output voltage in response to the electrical test voltage with the first voltage level;
applying an electrical test voltage with a second voltage level to the test terminal of the overvoltage protection circuit, wherein the second voltage level is lower than the first voltage level;
capturing a second electrical output voltage in response to the electrical test voltage with the second voltage level; and
checking whether the captured first output voltage and the captured second output voltage satisfy at least one test criterion to generate a test result.

* * * * *